(12) United States Patent
Suzuki

(10) Patent No.: US 7,469,812 B2
(45) Date of Patent: Dec. 30, 2008

(54) WIRE BONDING APPARATUS

(75) Inventor: Shinsuke Suzuki, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 209 days.

(21) Appl. No.: 11/033,826

(22) Filed: Jan. 13, 2005

(65) Prior Publication Data

US 2005/0218194 A1 Oct. 6, 2005

(30) Foreign Application Priority Data

Apr. 1, 2004 (JP) .............................. 2004-108932

(51) Int. Cl.
*B23K 31/02* (2006.01)

(52) U.S. Cl. ..................... 228/4.5; 228/180.5

(58) Field of Classification Search .............. 228/180.5, 228/4.5, 220, 262, 225, 231, 232, 214
See application file for complete search history.

(56) References Cited

U.S. PATENT DOCUMENTS

| 5,295,619 | A | * | 3/1994 | Takahashi et al. | ........ | 228/180.5 |
| 5,527,740 | A | * | 6/1996 | Golwalkar et al. | ............ | 29/827 |
| 5,558,267 | A | * | 9/1996 | Humphrey et al. | ........... | 228/4.5 |
| 5,666,003 | A | * | 9/1997 | Shibata et al. | ............... | 257/796 |
| 6,133,067 | A | * | 10/2000 | Jeng et al. | .................... | 438/110 |
| 6,302,317 | B1 | * | 10/2001 | Narita et al. | ................. | 228/254 |
| 6,423,102 | B1 | * | 7/2002 | Fukunaga et al. | .......... | 29/25.01 |
| 6,491,202 | B1 | * | 12/2002 | Kyomasu et al. | ............. | 228/1.1 |
| 6,824,037 | B2 | * | 11/2004 | Sakai et al. | .................... | 228/4.5 |
| 2003/0052393 | A1 | * | 3/2003 | Michii et al. | ................. | 257/678 |

FOREIGN PATENT DOCUMENTS

| JP | 5304358 | | 11/1993 |
| JP | 5343446 | | 12/1993 |
| JP | 11-026493 | * | 1/1999 |
| JP | 2000-235991 | * | 2/1999 |
| JP | 2000-235991 | * | 8/2000 |
| JP | 2000235991 | | 8/2000 |

* cited by examiner

*Primary Examiner*—Kevin P Kerns
*Assistant Examiner*—Michael Aboagye
(74) *Attorney, Agent, or Firm*—Kubotera & Associates, LLC

(57) ABSTRACT

A wire bonding apparatus includes a heat block (121) and a heat plate (122) provided on the heat block (121). A recess (1221) is provided in the heat plate (122) to receive the first semiconductor chip (41) and wires (51) without contact therewith when the lead frame (50) is provided on the heat plate (122) such that the first main surface (501) of the lead frame (50) faces toward heat plate. A duct (13) is provided in the heat plate (122) to connect the recess (1221) to the outside of the heat plate (122). A gas supplied through the duct (13) is heated by a heater (14) and discharged into the recess (1221).

12 Claims, 6 Drawing Sheets

WIRE BONDING APPARATUS

BACKGROUND OF THE INVENTION

1. Field of the Invention

The present invention relates to a wire bonding apparatus and a wire bonding method using the wire bonding apparatus.

2. Description of the Related Art

The wire bonding is a technique for connecting a semiconductor chip and a lead frame or the like with metal wires. To effect wire bonding, the semiconductor chip and lead frame are heated to a temperature suitable for wire bonding. It is known that an oxide film is made on the surfaces of a lead frame by the heating, causing poor bondage of the metal wires. The production of an oxide film presents a problem in die bonding, too. To solve the problem, it has been proposed to blow a hot gas to the lead frame prior to die bonding or jet a hot gas to the lead frame prior to wire bonding, thereby preventing the lead frame from being subjected to heat treatment for a long period of time. See JP 2000-235991 and JP 05-343446.

With an advancement of high-density mounting of multi-functional semiconductors, a lead frame type multichip package in which semiconductor chips are mounted on both the front and back surfaces of a lead frame has been proposed. However, the manufacture of the lead frame type multichip package has the following problem. The lead frame with one surface having been connected to a semiconductor chip with wires must be mounted on the heat plate such that the semiconductor and wires face downward. Consequently, it is necessary to provide a recess in the heat plate to receive the semiconductor chip and wires that have been mounted on the back side of the lead frame. The recess, however, reduces the heat transmission efficiency, preventing the semiconductor chip on the front surface of the lead frame from reaching the wire bonding temperature.

SUMMARY OF THE INVENTION

Accordingly, it is an object of the invention to provide a reliable wire bonding apparatus capable of wire bonding a semiconductor to the front surface of a lead frame with the back surface having been connected to another semiconductor and a wire bonding method using such an apparatus.

According to one aspect of the invention there is provided a wire bonding apparatus including a mounting base for supporting a lead frame having opposed first and second main surfaces such that a first semiconductor chip connected to the first main surface with at least one first wire faces downward, the mounting base having a recess for receiving the first chip and first wire without contact therewith; a heater for heating the mounting base; a duct provided within the mounting base to connect the recess to an outside of the mounting base; and a gas supply for supplying a gas to the recess through the duct.

According to another aspect of the invention there is provided a wire bonding method by which a second semiconductor chip is connected with at least one second wire to a second main surface of a lead frame, with a first main surface thereof having been connected to a first semiconductor chip with at least one first wire, which includes the steps of providing the lead frame on a mounting base such that the first semiconductor chip and wire are received by a recess of the mounting base without the first wire coming into contact with the recess; and supplying the recess with a gas through a duct to heat the second semiconductor chip.

According to the invention, when the lead frame is mounted on the mounting base with the first main surface facing toward the mounting base, the first wires are neither broken nor deformed, thus preventing poor bondage of the first wires and drops in the yield and reliability of the product. The hot gas discharged into the recess promotes the heat transmission to the second semiconductor chip so that the second semiconductor is heated up quickly to the wire bonding temperature, providing a more reliable wire bonding with a higher efficiency. In addition, the production of an oxide film on the surfaces of a lead frame by a prolonged exposure to high temperatures is suppressed.

DESCRIPTION OF THE PREFERRED EMBODIMENTS

First Embodiment

The first embodiment of the invention will now be described with reference to FIGS. 1-3.

Figure 1:
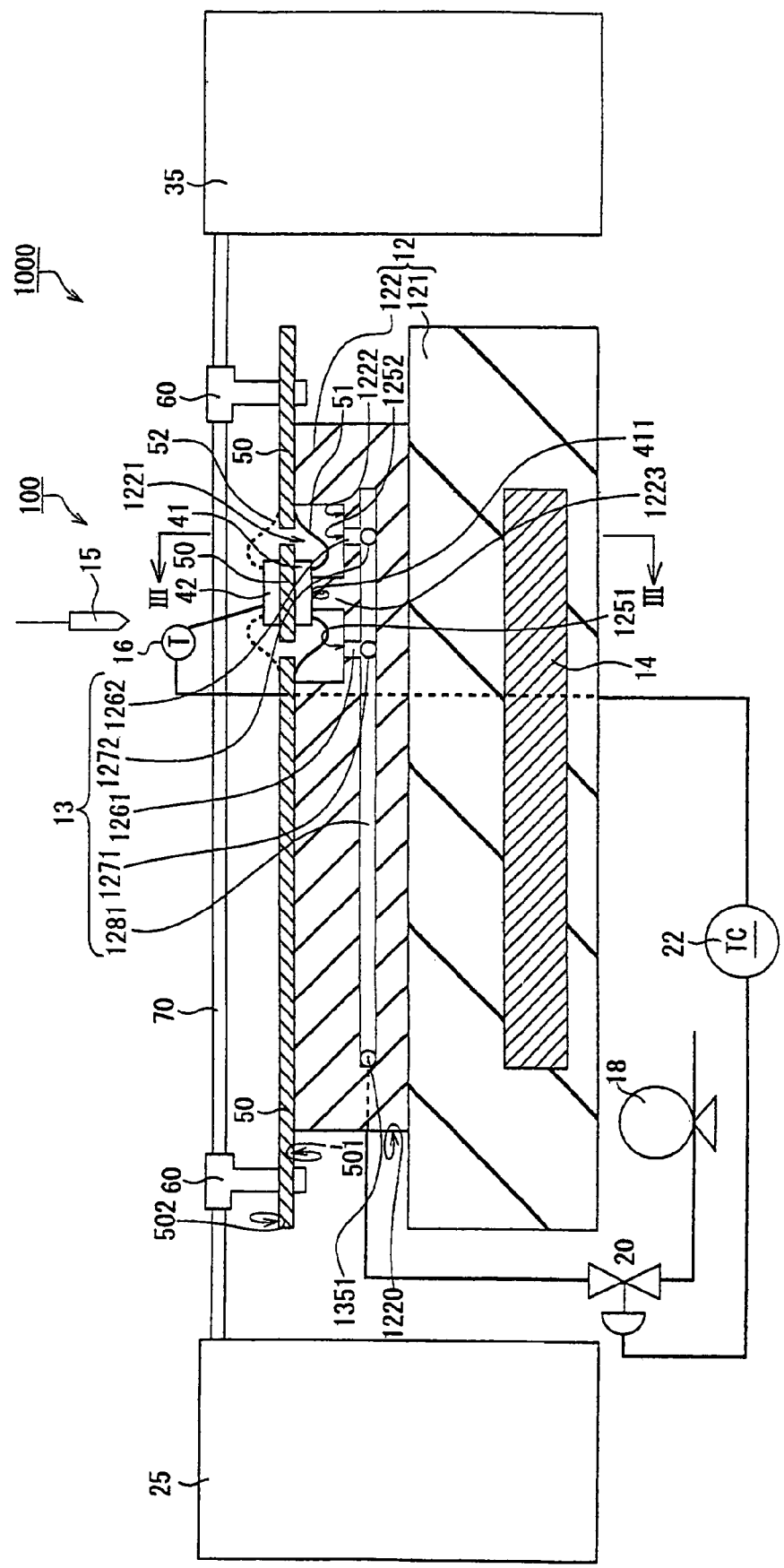
FIG. 1 is a sectional view taken along lien I-I of FIG. 2.

As best shown in FIG. 1, a wire bonding apparatus 1000 includes a supply magazine 25, a receiving magazine 35, and a wire bonding section 100 provided between them. The supply magazine 25 houses a predetermined number of lead frames to be wire bonded in the wire bonding section 100. A pair of transportation claws 60 hold an edge of a lead frame 50 and move along a guide rail 70 to transport the lead frame 50 from the supply magazine 25 to the bonding section 100.

The first and second semiconductor chips 41 and 42 are mounted on the first and second main surfaces 501 and 502 of the lead frame 50. The first semiconductor chip 41 has been connected to the first main surface 501 with the first wire 51. The lead frame 50 is transported from the supply magazine 25 such that the first and second semiconductor chips 41 and 42 are disposed on the lower and upper sides of the lead frame 50, respectively. The lead frame 50 is mounted on a heat plate 122 of the bonding section 100 to connect the second semiconductor chip 42 to the lead frame 50.

The receiving magazine 35 houses the predetermined number of lead frames on which wire bonding has been completed in the bonding section 100. The transportation of the lead frames 50 from the bonding section 100 to the receiving magazine 35 is made by the transportation claws 60 that move along the guide rail 70. The bonding section 100 will be described below in detail.

The bonding section 100 includes a mounting base 12, a duct 13, a heater 14, a capillary 15, a temperature detector 16, a gas supply 18, a gas flow regulator 20, and a temperature control 22. The mounting base 12 includes a heat block 121 in which the heater 14 is disposed and a heat plate 122 attached to the heat block 121 for supporting the lead frame 50 thereon. The heater 14 is a cartridge type heater that has an insulative bar and a heat generating coil put around the bar.

The heat block 121 is made of stainless steel and transmits heat from the heater 14 to the heat plate 122. The heat plate 122 is made of iron (Fe) and transmits the heat from the heat block 121 to the lead frame 50 mounted on the heat plate 122.

A recess 1221 is provided in the heat plate 122 to receive the first semiconductor chip 41 and the first wires 51 such that the first wires 51 are not in contact with the heat plate 122. Consequently, when the lead frame 50 is mounted on the heat plate 122 with the first semiconductor chip 41 facing down, the first wire 51 are not broken or deformed, thus keeping the good bonding condition and preventing drops in the yield and the reliability of the product caused by the poor bondage of the first wire.

A raised portion 1223 is provided on the bottom 1222 of the recess 1221 so as to come into contact with a bonding surface 411 of the first semiconductor chip 41 to transmit heat from the heater to the first semiconductor chip 41. The duct 13 is provided within the heat plate 122 to connect the recess 1221 to the outside of the heat plate 122. It has openings 1251 and 1252 in the recess 1221 and an opening 1351 in the heat plate 122. A gas is supplied through the opening 1351 and discharged through the openings 1251 and 1252. The number and positions of the discharge openings 1251 are not critical as long as the gas is discharged into the recess 1221. The heat plate 122 is replaceable according to the type of the lead frame 50 and may be made of ceramic. It is appreciated that the heat plate 122 has such a size that its side walls 1220 are disposed inside the side walls 1210 of the heat block 121 to prevent the uneven temperature inside the heat plate 122 due to the uneven heat transmission from the heat block 121.

The capillary 15 is attached to the tip of a bonding head (not shown) so as to be moved in X, Y, and Z directions for performing wire bonding with the second thin wire of metal such as gold. The temperature detector 16 detects the temperature of the second semiconductor chip 42 mounted on the upper side of the lead frame 50 and sends a temperature signal to the gas flow control 22. It has a thermocouple to be brought into contact with the second semiconductor chip 42 to measure its surface temperature. It may be of the non-contact type by which the thermocouple is disposed above the second semiconductor chip 42 to measure the surface temperature.

The gas supply 18 includes a pump for supplying a gas or air to the recess 1221 through the duct 13. The gas may be an inert gas or a nitrogen (N2) gas. The gas flow regulator 20 regulates the gas flow from the gas supply 18 in response to a signal from the temperature control 22. The temperature control 22 controls the gas flow regulator 20 in response to a surface temperature signal from temperature detector 16 so that the surface temperature of the chip 40 is kept at a predetermined temperature. The arrangement of the duct 13 will be described with reference to FIGS. 1-3.

Figure 2:
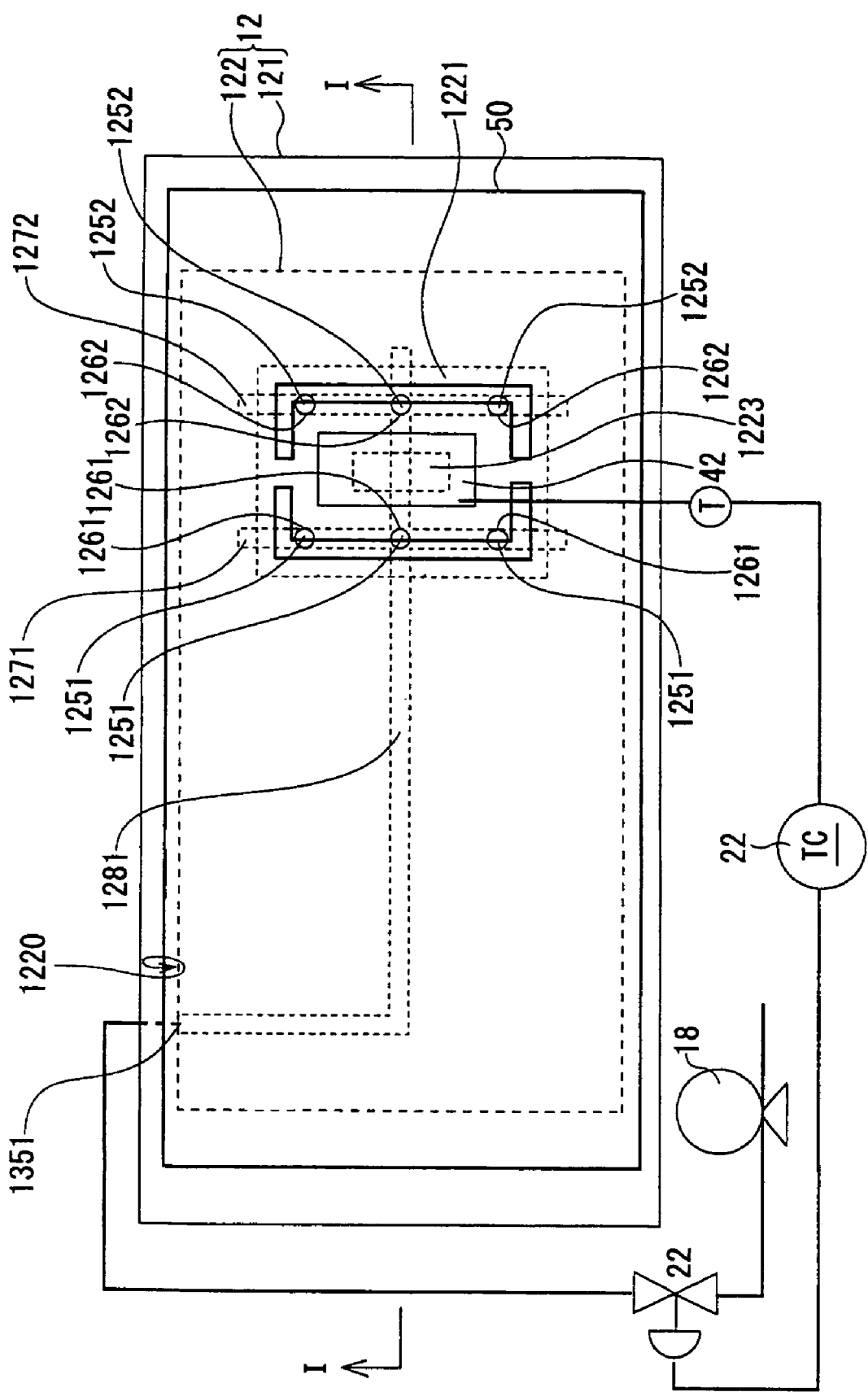
FIG. 2 is a top plan view of a wire bonding apparatus according to the first embodiment of the invention.
Figure 3:
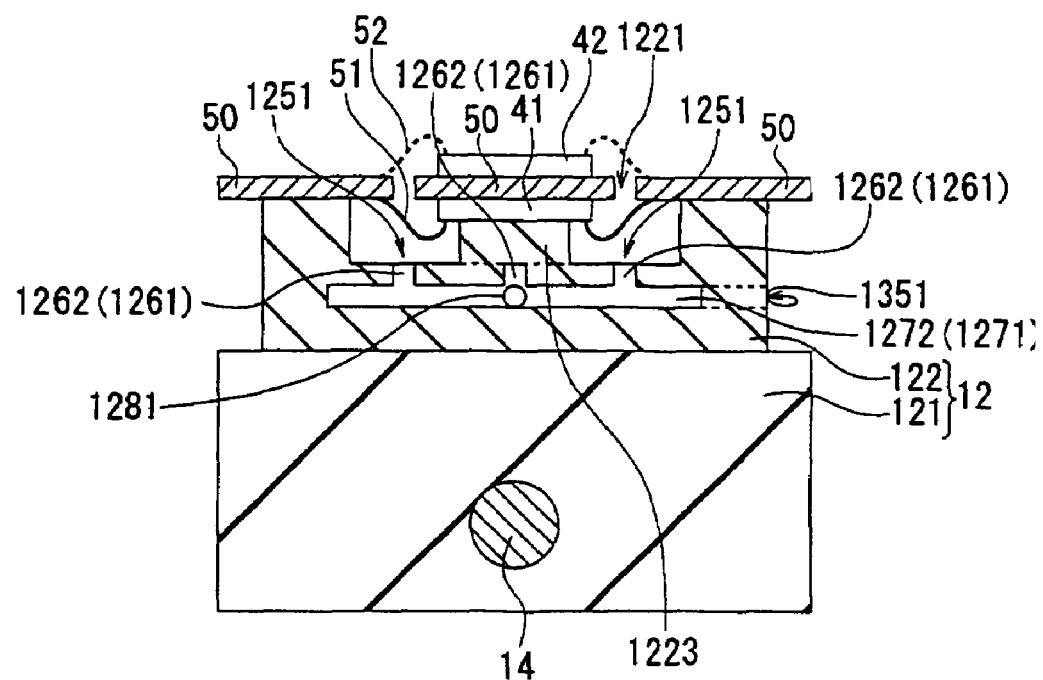
FIG. 3 is a sectional view taken along line III-III of FIG. 1.

As best shown in FIGS. 2-3, two sets of the three discharge openings 1251 and 1252 are disposed on opposite sides of the raised portion 1223, respectively. As best shown in FIGS. 1-3, tow sets of three vertical tubes 1261 and 1262 extend downwardly from the discharge openings 1251 and 1252 to horizontal tubes 1271 and 1272, respectively. A long horizontal tube 1281 extends along the longitudinal direction of the heat plate 122 and communicates with the horizontal tubes 1271 and 1272. The long tube 1281 has an opening 1351 in a side wall 1220 of the heat plate 122 and is connected to the pump 18.

How the wire bonding apparatus 1000 works will be described with reference to FIG. 1.

First of all, the lead frame 50 is transported from the supply magazine 25 to a predetermined position on the heat plate 122 such that the first semiconductor chip 41, which has been connected with the first wire 51, faces downward in the recess 1221. At this point, the bonding surface 411 of the first semiconductor chip 41 is in contact with the raised portion 1223 of the recess 1221. Then, the second semiconductor chip 42 and the lead frame 50 are heated to a temperature suitable for wire bonding (hereinafter "wire bonding temperature"). While the second semiconductor chip 42 is heated to the wire bonding temperature, the lead frame 50, which is in close contact with the heat plate 122, is heated to the wire bonding temperature. Thus, by heating the second semiconductor chip 42 to the wire bonding temperature, it is possible to effect wire bonding.

In response to a temperature signal from the temperature detector 16 in contact with the second semiconductor chip 42, the temperature control 22 regulates the gas flow with the gas flow regulator 20 to control the surface temperature of the second semiconductor chip 42. When the second semiconductor chip 42 and the lead frame 50 are heated to the wire bonding temperature, the capillary 15 is moved by the well know method to connect them with the second wires 52.

The second semiconductor chip 42 is heated by heat transmission from the first semiconductor chip 41 that is heated by both the heat transmission from the raised portion 1223 and the hot gas discharged into the recess 1221. Consequently, the second semiconductor chip 42 is heated to the wire bonding temperature so quickly that the formation of a surface oxide film otherwise produced by a prolonged exposure to the high temperature is prevented, thereby providing a more reliable wire bonding than before with a higher yield.

Since the discharge openings 1251 and 1252 are disposed symmetrically across the raised portion 1223 so that the first semiconductor chip 41 is heated uniformly, making it possible to effect even transmission of heat from the first semiconductor chip 41 to the second semiconductor chip 42 to improve the wire bonding reliability. The lead frame 50 with the both sides having been wire bonded is transported to the receiving magazine 35.

Figure 4:
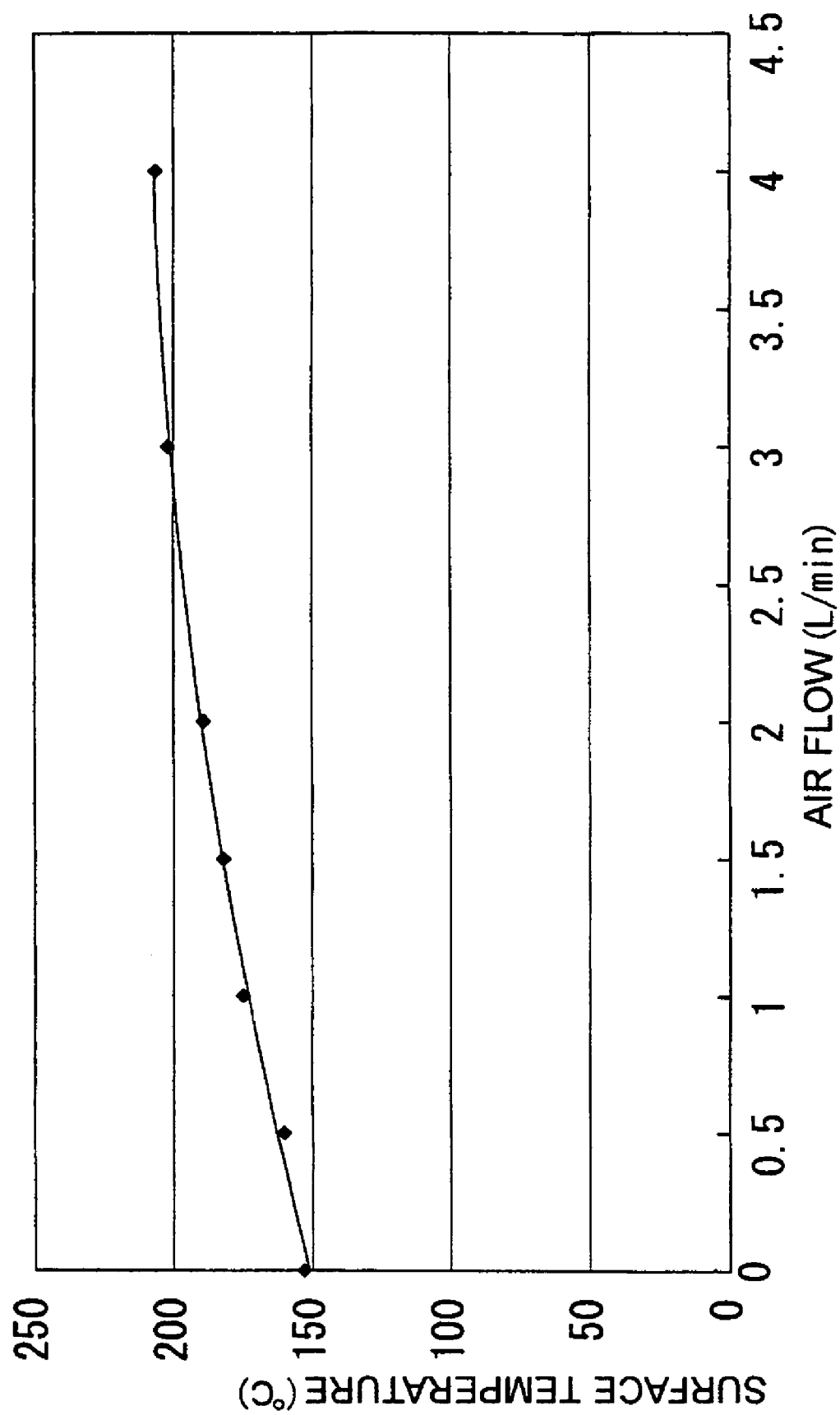
FIG. 4 is a graph showing the chip surface temperature vs. the air flow.

The relationship between the surface temperature of the second semiconductor chip 42 and the air flow discharged into the recess will be described with reference to FIG. 4. When no air is supplied (0 L/min), the surface temperature of the second semiconductor chip 42 is about 150° C. but, when the hot air is discharged into the recess, it becomes higher than 150° C. For example, it is about 210° C. at an air flow of 4 L/min. Thus, by regulating the gas flow discharged into the recess 1221, it is possible to heat quickly the second semiconductor chip 42 to the wire bonding temperature.

Second Embodiment

The wire bonding apparatus and method according to the second embodiment of the invention will be described with reference to FIGS. 5 and 6. The main difference from the first embodiment is that a duct 33 for connecting a recess 1221 to the outside of the heat block 121 extends along the heater 14 within the heat block 121. The same components as those of the first embodiment are given the same reference numbers and their description will be omitted.

Figure 5:
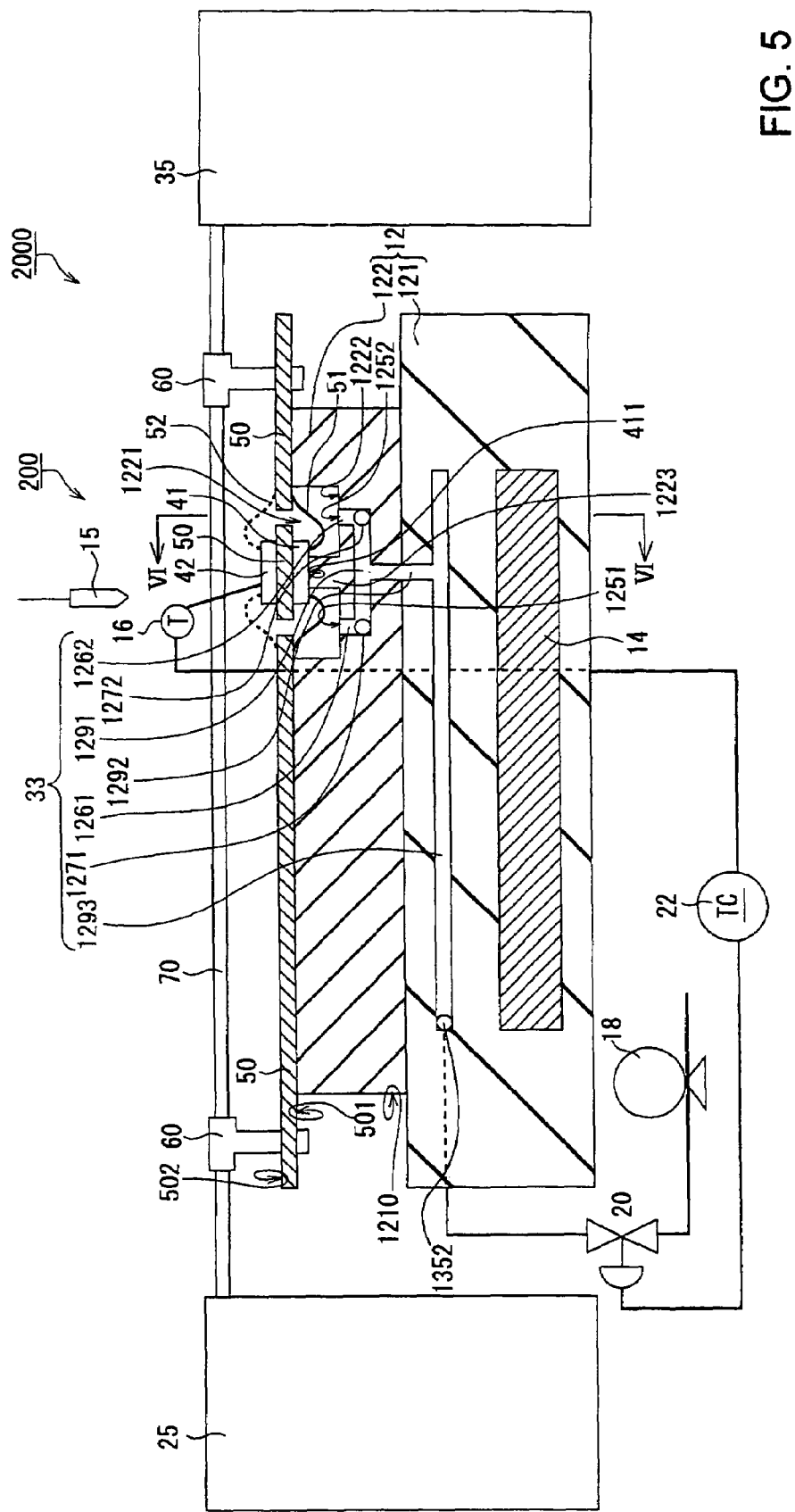
FIG. 5 is a sectional view of a wire bonding apparatus according to the second embodiment of the invention.
Figure 6:
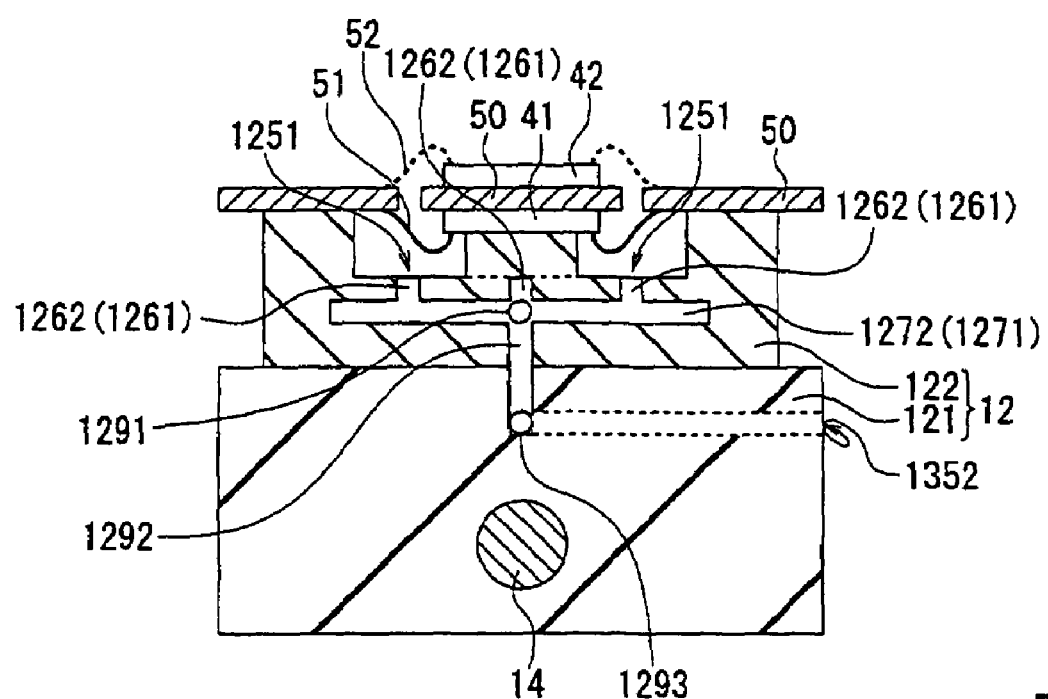
FIG. 6 is a sectional view taken along line VI-VI of FIG. 5.

As shown in FIG. 5, the wire bonding apparatus 2000 includes a wire bonding section 200 in which the duct 33 connecting the recess 1221 and the outside of the heat block 121 is provided. The duct 33 has the discharge openings 1251 and 1252 in the recess 1221 and an opening 1352 in the heat block 121. Also, it has a horizontal tube extending along the heater 14. A gas is supplied through the opening 1352 and discharged through the discharge openings 1251 into the recess 1221. The arrangement of the duct 33 will be described in more detail with respect to the FIGS. 5 and 6.

Similarly to the first embodiment, two sets of the vertical tubes 1261 and 1262 extend downward from the discharge openings 1251 and 1252 in the bottom 1222 of the recess 1221 toward the heat block 121. A pair of horizontal tubes 1271 and 1272 communicate with the two sets of vertical tubes 1261 and 1262 on either side of the raised portion 1223. A horizontal tube 1291 connects the horizontal tubes 1271 and 1272. A vertical tube 1292 extends downward from the horizontal tube 1291 into the heat block 121. A long horizontal tube 1293 extends along the heater 14 in the longitudinal direction of the heat block 121 and communicates with the vertical tube 1292. The long tube 1293 has an opening 1352 in a side wall 1210 of the heat block 121 which is connected to the pump 18.

The wire bonding apparatus 2000 is operated in the same manner as that of the first embodiment and its description will be omitted.

Since a portion of the duct 33 extends along the heater 14, the heat transmission from the heater to the gas in the duct is so efficient that the temperature of the gas discharged into the recess is higher than that of the first embodiment for the same heater temperature and gas flow. Consequently, the second semiconductor chip 42 is heated up to the wire bonding temperature sooner than that of the first embodiment, thus making the productivity higher than that of the first embodiment. The arrangement of the duct may be modified according to the uses.

The invention claimed is:

1. A wire bonding apparatus for wiring a lead frame having a first semiconductor chip on a first main surface and a second semiconductor chip on a second main surface opposite said first main surface so that said second semiconductor chip is connected to said second main surface through a second wire, comprising:
    a mounting base for supporting said lead frame such that said first main surface connected to said first semiconductor chip through a first wire faces downward, said mounting base having a recess for receiving said first semiconductor chip and said first wire without contact therewith;
    a raised portion on a bottom of said recess for contacting with a surface of said first semiconductor chip that is connected to said first wire;
    a duct within said mounting base to connect said recess to an outside of said mounting base such that gas passes through said duct, said duct having at least two openings, said at least two openings located at a bottom of said recess at respective positions not covered by said first semiconductor chip;
    a heater for heating said mounting base and gas passing through said duct; and
    a gas supply for supplying gas heated by said heater to said recess through said duct.

2. The wire bonding apparatus according to claim 1, wherein said heat plate has a support surface for supporting said lead frame, said recess extends downward from a level of said support surface, and said duct is within said heat plate.

3. The wire bonding apparatus according to claim 2, wherein said duct has a duct portion that extends along said heater.

4. The wire bonding apparatus according to claim 1, which further comprises:
    a temperature detector for detecting a temperature of a surface of said second semiconductor chip to be connected to said second wire;
    a gas flow regulator for regulating flow of said gas supplied by said gas supply; and
    a temperature control unit for controlling said gas flow regulator so as to keep said surface of said second semiconductor chip at a wire bonding temperature where said second wire is to be connected.

5. The wire bonding apparatus according to claim 1, wherein said mounting base includes
    a heat block accommodating said heater therein, and
    a heat plate on said heat block, a perimeter of said heat plate being within a perimeter of said heat block.

6. A wire bonding apparatus for wiring a lead frame having a first semiconductor chip on a first main surface and a second semiconductor chip on a second main surface opposite said first main surface so that said second semiconductor chip is connected to said second main surface through a wire, comprising:
    a mounting base for supporting said lead frame such that said first main surface faces downward, said mounting base having a recess for receiving said first semiconductor chip;
    a raised portion provided on a bottom of said recess for contacting said first semiconductor chip;
    a duct disposed in said mounting base for passing gas therethrough, said duct having at least two openings, said at least two openings located at a bottom of said recess at respective positions not covered by said first semiconductor chip;
    a heater for heating said mounting base and said gas; and
    a gas supply for supplying said gas heated by said heater to said recess through said duct.

7. The wire bonding apparatus according to claim 6, further comprising:
    a temperature detector for detecting a temperature of said second semiconductor chip;
    a gas flow regulator for regulating a flow of said gas; and
    a temperature control unit for controlling said gas flow regulator to maintain said second semiconductor chip at a specific temperature.

8. The wire bonding apparatus according to claim 6, wherein said mounting base includes
    a heat block accommodating said heater therein, and
    a heat plate on said heat block, a perimeter of said heat plate being within a perimeter of said heat block.

9. A wire bonding apparatus for wiring a lead frame having a first semiconductor chip on a first main surface and a second semiconductor chip on a second main surface opposite said first main surface so that said second semiconductor chip is connected to said second main surface through a second wire, comprising:
    a mounting base supporting said lead frame such that said first main surface connected to said first semiconductor chip through a first wire faces downward, said mounting base having a recess receiving said first semiconductor chip and said first wire without contact therewith;
    a raised portion on a bottom of said recess contacting with a surface of said first semiconductor chip that is connected to said first wire;
    a duct within said mounting base connecting said recess to an outside of said mounting base such that gas passes through said duct, said duct having at least two openings;
    a heater heating said mounting base and gas passing through said duct; and
    a gas supply supplying gas heated by said heater to said recess through said duct,
    wherein each opening is located at a bottom of said recess at a position outside of a perimeter of said first semiconductor chip.

10. The wire bonding apparatus according to claim 9, further comprising a heat plate on said heat block, said heat plate having a support surface supporting said lead frame,
wherein said recess extends downward from a level of said support surface.

11. The wire bonding apparatus according to claim 9, further comprising:
a temperature detector detecting a temperature of a surface of said second semiconductor chip to be connected to said second wire;
a gas flow regulator regulating a flow of said gas supplied by said gas supply; and
a temperature control unit controlling said gas flow regulator so as to keep said surface of said second semiconductor chip at a wire bonding temperature where said second wire is to be connected.

12. An apparatus for wire bonding a front semiconductor chip to a lead frame, said lead frame having a rear surface and a front surface, said rear surface having a rear semiconductor chip connected thereto by a first wire, said front surface having said front semiconductor chip connectable thereto by a second wire, said apparatus comprising:
a mounting base that supports said lead frame so that
said rear surface faces downward,
said rear semiconductor chip is received in a recess of said mounting base, and
a raised portion at a bottom of said recess supports a surface of said rear semiconductor chip;
a duct in said mounting base that delivers a heated gas to said recess through a plurality of openings in a bottom of said recess,
wherein said rear semiconductor chip is dimensioned and disposed on said raised portion so as to be within a perimeter defined by said plurality of openings, and
wherein the heated gas, when delivered to said recess, quickly heats said front semiconductor chip to a wire bonding temperature so that said front semiconductor chip is wire bonded to said front surface by said second wire.

* * * * *